United States Patent [19]

Smith

[11] 3,968,383
[45] July 6, 1976

[54] NOISE LIMITER

[75] Inventor: John F. Smith, Warminster, Pa.

[73] Assignee: Narco Scientific Industries, Inc., Fort Washington, Pa.

[22] Filed: July 10, 1974

[21] Appl. No.: 486,968

[52] U.S. Cl. ............................... 307/237; 307/264; 328/165; 328/171; 330/149
[51] Int. Cl.² .......................................... H03K 5/08
[58] Field of Search ............ 307/237, 264; 328/165, 328/167, 171, 172, 173, 175; 330/149

[56] References Cited
UNITED STATES PATENTS

| | | | |
|---|---|---|---|
| 3,139,587 | 6/1964 | Peck | 307/237 X |
| 3,286,106 | 11/1966 | Deveson | 307/237 |
| 3,573,641 | 4/1971 | Zenk | 307/237 X |
| 3,576,449 | 4/1971 | Howell | 307/237 |

Primary Examiner—John Zazworsky
Attorney, Agent, or Firm—Paul & Paul

[57] ABSTRACT

In a radio receiver, noise limiter apparatus specifically designed to clip impulse noise and to pass the audio signal undistorted up to about 80% carrier modulation. The noise limiter comprises a clipping circuit which is normally turned on by the audio signal to pass same, and a noise impulse amplifier branch containing an amplifier which is edgetriggered to cause clipping during the presence of noise impulses and to eliminate an output from the impulse amplifier when an audio signal is present.

4 Claims, 2 Drawing Figures

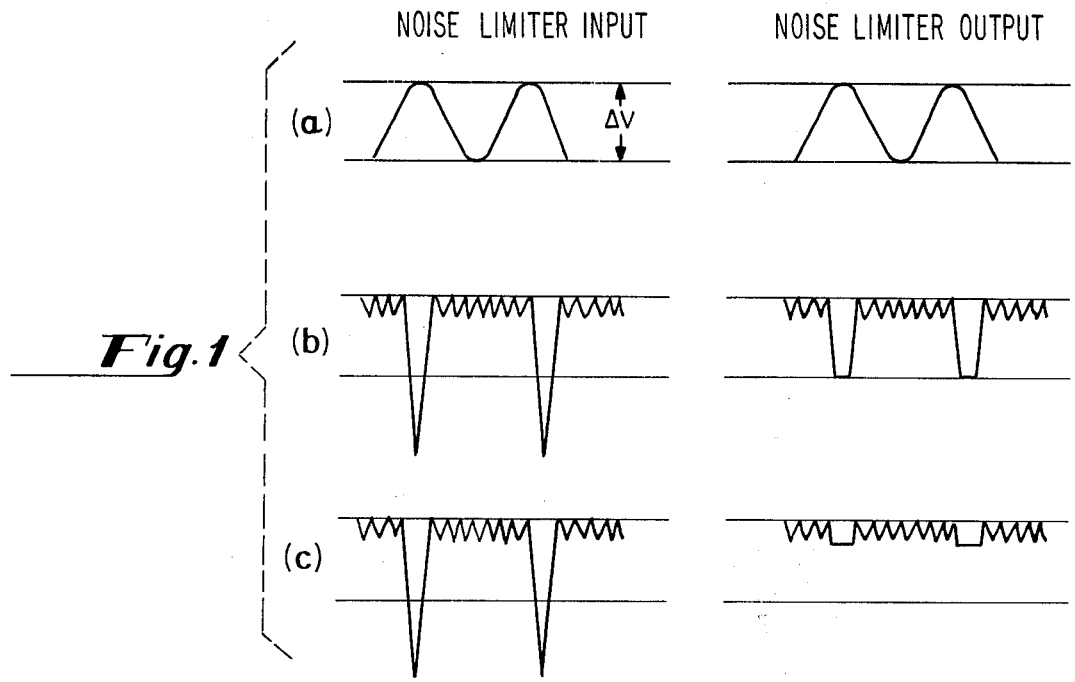
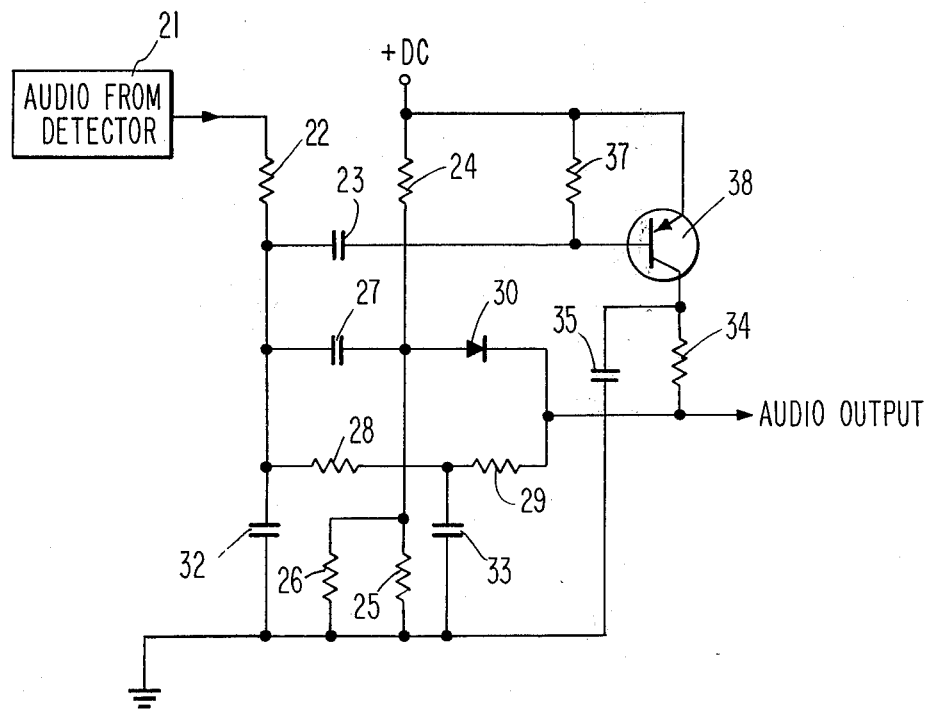

NOISE LIMITER

BACKGROUND OF THE INVENTION

1. Field of the Invention

This invention relates to noise limiters, particularly radio receiver noise limiters for limiting passage of impulse noise in the absence of an audio signal.

2. Background of the Invention

The typical noise limiter as heretofore used in radio receivers, and particularly aircraft radio receivers, contains a substantial disadvantage in terms of the amount of clipping which is possible. In such prior art limiters, the limiter is turned on with the carrier (or with the audio signal), and clipped when the signal exceeds a predetermined value. Such limiters inherently contain a trade-off between the two basic requirements of a noise limiter, i.e., the need to clip noise (and particularly impulse noise), and to pass the audio undistorted. The more effective the limiter is in clipping the impulse noise, the more serious is the distortion of the audio signal. Generally, the procedure followed is to specify the percentage modulation which is to be passed undistorted, thus providing a clipping level, and to clip both audio signal and noise which exceeds such level. In most modern solid state receivers the receiver white noise present at the input to the noise limiter does not exceed the clipping level and impulse noise which appears on top of the white noise is carried through to the limiter output, clipped only to the predetermined carrier modulation level. Thus, in operation of prior art noise limiter circuits, in the absence of an audio signal the impulse noise output from the limiter is substantially as great as the undistorted signal when audio is present.

SUMMARY OF THE INVENTION

It is a primary object of this invention to provide an improved noise limiter wherein the impulse noise at the output is clipped to substantially the receiver white noise level without introducing any additional distortion when an audio signal is present.

It is a further object of this invention to provide a noise limiter circuit which provides a clipping level at a level equal to a predetermined percentage of modulation, while clipping impulse noise in the absence of an audio signal (or other information signal) at a level substantially below the audio clipping level, thereby substantially reducing the impulse noise at the output without adversely affecting the fidelity of the audio output.

In accordance with the above objectives, there is provided noise limiter apparatus adapted to be utilized in a radio receiver for operating on a detected signal containing an audio component and a noise component, having a bias sensitive clipping means connected between its input and output for providing signal clipping as a function of received bias signals, and a noise sensitive bias signal circuit connected to the clipping means for providing a back biasing signal for causing clipping as a function of detected impulse noise. The back bias circuit preferably contains a differentiating circuit for blocking transmission of the audio signal, and an amplifier driven by the output of the differentiating circuit for providing an edge-triggered back bias signal to the clipping means so as to limit the passage of impulse noise while eliminating any output from the amplifier and thus passing the input signal through the clipper when an audio signal is present.

BRIEF DESCRIPTION OF THE DRAWINGS

FIG. 1 includes portions designated a, b, and c, which for convenience are hereinafter respectively referred to as FIGS. 1a, 1b, and 1c.

FIG. 1a illustrates a hypothetical audio input to the noise limiter at the desired maximum modulation percentage, and the corresponding output of a noise limiter which clips at such maximum level.

FIG. 1b shows a noise input containing both white noise and impulse noise, and the corresponding output from a conventional noise limiter designed to limit at the same percentage modulation as shown in FIG. 1a.

FIG. 1c shows the same noise input as in FIG. 1b, and the corresponding noise limiter output for the apparatus of this invention.

FIG. 2 is a schematic diagram showing the noise limiter apparatus of this invention.

DESCRIPTION OF THE PREFERRED EMBODIMENT

Referring now to FIG. 1a, there is shown a curve indicating a noise limiter audio input with peak-to-peak amplitude of $\Delta V$, corresponding to the maximum desired amount of modulation. In the limiter of this invention, by way of illustration, it is desired that the noise limiter pass the audio up to the equivalent of 80% modulation with a 1 kHz modulated RF carrier of 500 microvolts. Corresponding to such an audio input, the noise limiter output, as seen in the right hand curve of FIG. 1a, is undistorted. For greater audio inputs, the limiter clips the audio, thus producing audio distortion.

In FIG. 1b, the left hand curve illustrates a noise input without audio to a limiter, the noise containing lower magnitude white noise plus impulse noise. In the typical prior art limiter, the impulse noise is clipped within the $\Delta V$ limit, such that the output of the noise limiter does constitute an improvement over the input but nonetheless contains impulse spikes on the same order of magnitude as the maximum undistorted audio signal which is passed through the limiter.

In FIG. 1c, there is illustrated the same input signal as shown in FIG. 1b, and the corresponding noise limiter output for the apparatus of this invention. By comparing FIG. 1c with FIG. 1b, it is seen that a substantial improvement is obtained in that the noise impulse spikes are clipped at approximately the same level as the white noise. This improvement in noise output is obtained without sacrificing in any way the ability of the detector to pass the audio signal up to the predetermined level of modulation.

Referring now to FIG. 2, there is illustrated the preferred embodiment of the noise limiter apparatus of this invention. The audio signal, along with noise which has been picked up, is provided as shown in block 21. It is to be understood that block 21 in fact represents, in a typical avionics environment, an entire radio receiver from the pick-up antenna through the amplifier stages to and including the audio detector. Such a receiver, as is well known, typically contains an AGC circuit which provides negative feedback as the radio frequency carrier level increases, such that the noise output from block 21 is reduced in the presence of the RF carrier (and thus when an audio signal is present).

The output from block 21, containing both an audio and noise component, is connected through resistor 22 to capacitors 23, 27 and 32, as well as resistor 28. Capacitor 27 is also connected to the anode of diode 30, the cathode of which is connected to the output of the limiter. The audio signal is thus available to pass through capacitor 27 and diode 30 to the output, depending upon the condition of diode 30. Diode 30 has a fixed DC bias at its anode which is provided by a plus DC source connected through resistor 24 (which is connected to the anode of diode 30) and the parallel combination of resistors 25 and 26 to ground. Resistor 26 is suitably a variable resistor, the value of which is selected to set the clipping level of the noise limiter at the desired level. Resistor 28 is connected through capacitor 33 to ground, and also through resistor 29 to the cathode of diode 30. Resistors 28 and 29, in combination with capacitors 32 and 33, provide a low frequency bias to the cathode of diode 30. It is seen that, in the presence of audio from block 21, a forward bias signal is provided to the diode, thereby turning on the diode and permitting passage of the audio signal through to the output. Thus, a clipping means is provided which is turned on in the presence of audio to pass the audio signal, and which is set to clip any input signals which swing downward by more than a predetermined amount.

Still referring to FIG. 2, capacitor 23 is connected to the base of transistor 38. The base of transistor 38 is also connected through resistor 37 to the DC source, and the emitter of transistor 38 is likewise connected to the DC source. The output, or collector of transistor 38 is connected through resistor 34 to the cathode of diode 30, and through capacitor 35 to ground. The path from resistor 22 to the cathode of diode 30 comprises the noise pulse amplifier path, also referred to as the variable back bias path. Capacitor 23 and resistor 37 provide a differentiating circuit, producing a negative-going spike at the base of transistor 38 when an impulse noise spike is delivered from block 21. At the same time, the combination of capacitor 23 and resistor 37 filters out the relatively low frequency audio signal, such that transistor 38 is turned on only by the sharp-edged noise signals. When a negative-going spike turns on transistor 38, the DC voltage is gated through the transistor and through resistor 34 to the cathode of diode 30, thus back biasing it and causing clipping of the signal. When transistor 38 is turned on, capacitor 35 is charged up to plus DC (nominally +8 volts) essentially instantaneously, and after the differentiated noise spike has left the base of the transistor 38, the back bias is held on the cathode of diode 30 until capacitor 35 discharges through resistor 34. Thus, the value of capacitor 35 determines the time that diode 30 is biased off, which time is set to correspond approximately to the average duration of a noise impulse spike.

In practice, it has been found that excellent performance of the circuit of FIG. 2 is obtained when the components as shown below in Table I are utilized.

TABLE I

| Component Number Designation | Component Type And Value |
|---|---|
| 22 | Resistor, 1 k |
| 23 | Capacitor, .001 mf |
| 24 | Resistor, 8.2 k |
| 25 | Resistor, 33 k |
| 26 | Resistor, adjustable |
| 27 | Capacitor, 1.0 mf |
| 28 | Resistor, 100 k |
| 29 | Resistor, 100 k |
| 30 | Diode, CR104 |

TABLE I-continued

| Component Number Designation | Component Type And Value |
|---|---|
| 32 | Capacitor, 390 pf |
| 33 | Capacitor, 1.0 mf |
| 34 | Resistor, 220 k |
| 35 | Capacitor, .05 mf |
| 37 | Resistor, 47 k |
| 38 | Transistor, 2N5356 |

In operation, the circuit shown in FIG. 2 utilizing the component values as indicated in Table I produces the noise limited output as shown in FIG. 1c, while passing an audio level equivalent to about 80% modulation with a 1 kHz modulated RF carrier of 500 mv.

It is to be appreciated that the design figures as shown in Table I are illustrative only, and are presented in order to provide the best known embodiment of the invention claimed herein. As is known to anyone of skill in this art, variations in the design may be achieved to provide substantially equivalent performance, which variations are within the scope of this invention. For example, the back bias path could be altered to provide a slightly different frequency response, or to provide a different noise impulse threshold level. Likewise, the clipping path which is illustrated to comprise diode 30 could provide an alternate means for carrying out the clipping and setting the clipping level.

I claim:

1. In a radio receiver having an AGC circuit and an audio detector, which audio detector delivers signals having both audio and noise components, noise limiter apparatus comprising:
   a. input means for connecting said detector signals to said noise limiter apparatus;
   b. output means for providing an output signal;
   c. clipping means connected between said input means and said output means for clipping input signals above a predetermined level while normally passing said delivered signals which are below said level;
   d. differentiating means connected to said input means for differentiating said input signal so as to block transmission of said audio component and to detect presence of said noise component;
   e. back bias means for connecting a back bias to said clipping means, said back bias means having an input connected to the output of said differentiating means and controlled by the differentiating means signal; and
   f. holding means for holding said back bias on said clipping means for a predetermined time period following connection of said back bias to said clipping means by said back bias means.

2. Apparatus for clipping a relatively low frequency signal at a predetermined level while blocking noise impulses in said signal comprising:
   a. means for clipping signals presented at an input terminal as a function of bias signals;
   b. means for coupling said relatively low frequency signal with noise impulses to said input terminal;
   c. differentiation means, responsive to said means for coupling, for detecting a noise impulse; and
   d. means, responsive to said differentiation means, for producing an impulse signal and for back biasing said means for clipping with the produced impulse signal, whereby said low frequency signal is clipped at said predetermined level while noise impulses are blocked at said means for clipping by said produced impulse signal;

wherein said means for producing comprises a capacitor connected to said diode means and charged by said differentiation means, and a resistive discharge path for said capacitor.

3. Apparatus as described in claim 2 wherein said capacitor and said resistive path have magnitudes which afford a discharge time constant of the average duration of said noise impulses.

4. Apparatus as described in claim 3 wherein said differentiation means comprises a supply voltage, an R-C differentiator, and a transistor having its base coupled to said differentiator, said transistor being operable by said differentiator to couple said supply to said capacitor of said means for synthesizing.

* * * * *